(12) United States Patent
Kusnadi et al.

(10) Patent No.: US 8,607,168 B2
(45) Date of Patent: Dec. 10, 2013

(54) CONTOUR ALIGNMENT FOR MODEL CALIBRATION

(75) Inventors: Ir Kusnadi, San Jose, CA (US); Thuy Q Do, San Jose, CA (US); Yuri Granik, Palo Alto, CA (US); John L Sturtevant, Beaverton, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 84 days.

(21) Appl. No.: 13/092,440

(22) Filed: Apr. 22, 2011

(65) Prior Publication Data

US 2011/0202898 A1 Aug. 18, 2011

Related U.S. Application Data

(63) Continuation-in-part of application No. 13/029,113, filed on Feb. 16, 2011, now abandoned.

(60) Provisional application No. 61/304,807, filed on Feb. 16, 2010.

(51) Int. Cl.
*G06F 17/50* (2006.01)

(52) U.S. Cl.
USPC .............. 716/51; 716/52; 716/53; 716/54; 716/55; 716/56

(58) Field of Classification Search
USPC ................ 716/50–56; 430/5, 22, 30
See application file for complete search history.

(56) References Cited

U.S. PATENT DOCUMENTS

| | | | |
|---|---|---|---|
| 2007/0031745 A1* | 2/2007 | Ye et al. | 430/30 |
| 2010/0010784 A1* | 1/2010 | Cao et al. | 703/1 |
| 2011/0047520 A1* | 2/2011 | Chew et al. | 716/52 |
| 2011/0150343 A1* | 6/2011 | Agarwal et al. | 382/199 |

* cited by examiner

*Primary Examiner* — Paul Dinh
(74) *Attorney, Agent, or Firm* — Klarquist Sparkman, LLP

(57) ABSTRACT

Techniques for model calibration and alignment of measurement contours of printed layout features with simulation contours obtained with a model are disclosed. With various implementations of the invention, contour point errors are determined. Based on the contour point errors and a cost function, values of alignment parameters may be determined. The values of alignment parameters may be used to realign the measurement contours for model calibration. The alignment may be conducted concurrently with model calibration.

25 Claims, 8 Drawing Sheets

Misaligned

Self-aligned

CONTOUR ALIGNMENT FOR MODEL CALIBRATION

RELATED APPLICATIONS

This application claims priority to U.S. Provisional Patent Application No. 61/304,807, entitled "Contour Self-Alignment For OPC Model Calibration," filed on Feb. 16, 2010, and naming Ir Kusnadi et al. as inventors, which application is incorporated entirely herein by reference.

This application is a continuation-in-part of U.S. patent application Ser. No. 13/029,113, entitled "Contour Self-Alignment For Optical Proximity Correction Model Calibration," filed on Feb. 16, 2011 now abandoned, and naming Ir Kusnadi et al. as inventors, which application is incorporated entirely herein by reference.

FIELD OF THE INVENTION

The present invention is directed to the calibration of models used to simulate lithographic processes. Various implementations of the invention may be particularly beneficial to the model calibration based on contours of printed layout features.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

IC layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image created in the mask is often referred to as the intended or target image, while the image created on the substrate, by employing the mask in the photolithographic process is referred to as the printed image.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. Adding to the difficulty associated with increasingly smaller feature size is the diffractive effects of light. As light illuminates the mask, the transmitted light diffracts at different angles in different regions of the mask. These effects often result in defects where the intended image is not accurately "printed" onto the substrate during the photolithographic process, creating flaws in the manufactured device.

To address this problem, one or more resolution enhancement techniques are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

As previously noted, a layout design is made up of a variety of geometric elements, which typically are polygons. In some conventional "rule-based" optical proximity correction processes, geometric features that will increase the fidelity of the photolithographic process are automatically be added to geometric elements in the design. For example, some optical proximity correction processes may create serifs at one or more corners of a polygonal geometric element.

Still other types of optical proximity correction processes, sometimes referred to as "model-based" optical proximity correction processes, fragment the edges of the geometric elements in a design. More particularly, the individual edges of each geometric element are divided into smaller sections, often referred to as edge segments or edge fragments. The size of the fragments and which particular edges are to be fragmented are dependent upon parameters of the optical proximity correction process. The relative positions of the edge fragments relative are changed, and the new edge fragment locations are employed in a simulation of the actual lithographic process that will be used to manufacture the integrated circuit. The printed image produced by the lithographic process simulation is then compared with intended or "target" printed image, to see how closely the simulated printed image matches the target printed image. Based upon the degree of correspondence between the simulated printed image and the target printed image, the relative positions of the edge fragments are modified, and the lithographic process is simulated again using the new edge fragment locations. When the simulated printed image cannot be substantially improved by further displacement of the edge segments, it is often said that the optical proximity correction process has converged. This process of simulation, modification, and simulation is repeated until the simulated printed image sufficiently corresponds to the intended printed image, or until the optical proximity correction process has converged.

Layout designs can be very large. For example, one layout data file for a single layer of a field programmable gate array may be approximately 58 gigabytes. Accordingly, performing even a single iteration of an optical proximity correction process on a design is computationally intensive. Repeating a model-based optical proximity correction process until the simulated printed image matches the intended printed image, or until the optical proximity correction process has converged, only adds to the time required to finalize the layout design. Often, it can take as many as eight or more iterations for an optical proximity correction process to converge. Due to the number of required iterations of optical proximity correction and the complexity and size of modern layout designs, the time required to perform optical proximity correction is often measured in days. Even where advanced computer processing techniques are employed, performing model-based optical proximity correction may still take days.

One significant factor in model-based optical proximity correction is the model used to simulate the actual photolithographic manufacturing process. If the model is not accurate, then the corrected design data may still not print the desired image during the actual photolithographic manufacturing process. Accordingly, proper calibration of photolithographic manufacturing process simulation models is important.

At least two types of techniques for calibrating photolithographic manufacturing process simulation models conventionally have been used. Critical dimension (CD) based model calibration techniques rely on printing simple test structures, such as lines or rectangles of varying sizes, followed by measuring their widths and/or spaces at prescribed locations. CD measurements are typically collected in the form of a table consisting of gauges and their CD values, to which photolithographic manufacturing process simulation models then are calibrated by data fitting.

A second calibration technique, which uses contours of manufactured structures to augment CD-based model calibration, has been reported for many years now. Contour-based calibration uses contours extracted from top-down scanning electron microscope (SEM) images of printed features on a physical wafer. The contours of the actual manufactured structures then are compared with simulated printed images generated using the model. With contour-based calibration techniques, the calibration process is typically iterative, comparing SEM measured contours as input with simulated print images simulated using photolithographic manufacturing process simulation models that are improved with each iteration. In a hybrid calibration technique, the calibration uses a cost function that includes both CD and contour data.

Limitations as well as benefits of using either CD-based or contour-based model calibration have been enumerated. One of the primary metrology challenges in contour-based calibration is to properly import and overlay the measured physical contours (or measurement contours) onto the corresponding calibration features for the comparison. Because contour-based calibration typically includes root-mean-square (RMS) differences as a metric for comparing contour shapes, it is important that the measurement contours must be correctly aligned to be properly compared with the simulated printed image. Thus, contour-based calibration is sensitive to input misalignment of the measured contour data.

Some work has been made on accurately aligning measured contour data for model calibration. During post-metrology/pre-calibration steps, alignment is initially done by pattern matching, and then refined using edge placement error (EPE) criterion, which has improved model calibration quality. When a model for simulating a printed image is not yet available, alignment using the original layout design data (i.e., the target image) is perfectly acceptable, especially for structures with multiple features in the SEM image field of view (FOV). However, design features are not always printable on a wafer, and hence aligning SEM measured contours to the original layout design data is not always straightforward.

BRIEF SUMMARY OF THE INVENTION

Aspects of the invention relate to contour-based model calibration and alignment of measurement contours with simulation contours. The measurement contours are measured contours of printed layout features on a physical wafer. The measured contours may be derived using scanning electron microcopy (SEM). The simulation contours are calculated contours of the printed layout features derived based on a model. One example of such a model is an OPC model. The measurement contours are overlaid onto the corresponding simulation contours for the model calibration. With various implementations of the invention, contour point errors are determined. The contour point errors may be measured from a point on the measurement contours to a nearest point on the simulation contours or from a point on the simulation contours to a nearest point on the measurement contours. Based on the contour point errors and a cost function, values of alignment parameters may be determined. One example of the cost function is a weighted root mean square of the contour point errors. It should be appreciated that other forms of the cost function may be used. The values of alignment parameters can then outputted such as being stored in a medium and being displayed by a device.

The derived values of alignment parameters may be used to determine fitness of the model. According to various embodiments of the invention, the fitness is derived by calculating the value of the cost function based on the alignment parameters and the contour point errors. The derived fitness represents the fitness of the model after the alignment of the measurement contours with the simulation contours is adjusted according to the values of alignment parameters.

The values of alignment parameters may also be used to improve the model. The measurement contours are realigned to the simulation contours according to the values of alignment parameters. Based on the realigned measurement contours, the model may be adjusted or optimized according to traditional methods. The optimized model may be used to generate new simulation contours, which can be used in turn to determine fitness of the model. In some other embodiments of the invention, new values of the alignment parameters are determined based on the new simulation contours and the alignment of the measurement contours will be further adjusted along with the optimization of the model.

The alignment parameters of measurement contours with simulation contours comprise shift alignment parameters, a rotation alignment parameter, a scaling alignment parameter or any combination thereof. The shift alignment parameters correspond to translational misalignment. The rotation alignment parameter corresponds to rotational misalignment. The scaling alignment parameter corresponds to scaling misalignment.

DETAILED DESCRIPTION OF THE INVENTION

Optical Proximity Correction

In a photolithographic process, as explained above, electromagnetic radiation is transmitted through selectively transparent areas of a mask. The radiation passing through these transparent areas then irradiates desired portions of a layer of photoresistive material on a semiconductor substrate. The mask in turn is created from layout design data describing the geometric features that should be manufactured on the semiconductor substrate in order to create the desired circuit. For example, if a transistor should have a rectangular gate region, then the layout design data will include a rectangle defining that gate region. This rectangle in the layout design data is then implemented in a mask for creating the rectangular gate region.

During a photolithographic process, however, optical effects will prevent the shapes defined by the mask from being faithfully imaged onto the substrate. Diffractive effects, for example, may distort the image produced by a mask. Moreover, these distortions become more pronounced as the images produced by the mask become smaller relative to the wavelength of radiation used in the photolithographic process. Thus, the rectangular mask feature 101 illustrated in FIG. 1 may produce only the image 103. As seen in this figure, the image 103 is substantially narrower in the corners (e.g., corner 105) than the ideal rectangular shape intended by the mask feature 101. Likewise, the image 103 may have areas (e.g., 107) that extend beyond the ideal rectangular shape intended by the mask feature 101. Often the intended shape or feature is referred to as the target shape, or the target image, and typically corresponds to the mask feature 101. Additionally, the image created by employing the mask in a photolithographic process is often referred to as the printed image.

Figure 2A:
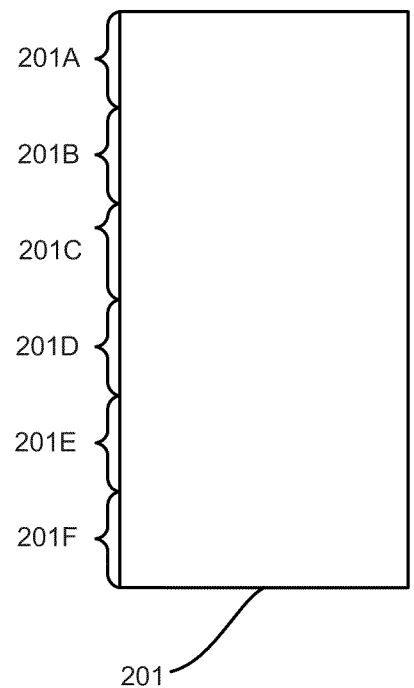
FIG. 2A illustrates edge fragmentation of a mask feature.

To correct for these optical distortions, many circuit designers will attempt to modify the layout design data to enhance the resolution of the images that will be produced by the resulting mask during the photolithographic process. Thus, some designers will employ an optical proximity correction (OPC) process on the layout design data, in an effort to better control the amplitude of the radiation transmitted by the mask at specific locations. In a conventional optical proximity correction process, the edges of the geometric elements in the design are fragmented. For example, as shown in FIG. 2A, an edge of the geometric element 201 used to create the mask feature 101 may be fragmented into edge fragments 201A-201F. The size of the edge fragments in a given layout design depends upon the optical proximity correction process parameters, often referred to as the optical proximity correction recipe. The "recipe" specifies the size of the edge fragments. Accordingly, not all edges within a layout design are fragmented in every optical proximity correction process.

Figure 1A:
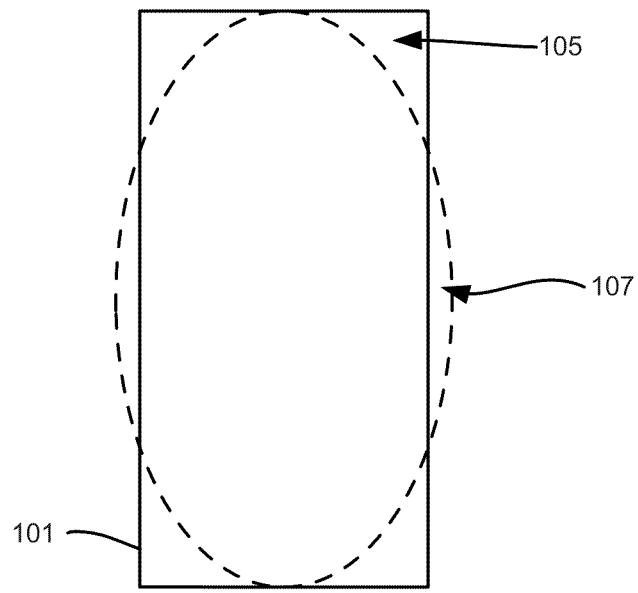
FIG. 1A illustrates a rectangular mask feature and a simulated printed image produced by the rectangular mask feature.

The optical proximity correction process also simulates the printed image. That is, the photolithographic process is simulated in order to produce a simulated printed image, such as the example image 103 shown in FIG. 1. This simulated image is compared to the target image. Typically, this comparison is done at each edge fragment. For example, as shown in FIG. 2B, the target image is a distance d1 away from the simulated printed image at the edge fragment 201A, the target image is a distance d2 away from the simulated printed image at the edge fragment 201C, while the target image intersects the simulated printed image at the edge fragment 201B. The distances between the target image and the simulated printed image are often referred to as the edge placement error (EPE). Accordingly, in most conventional optical proximity correction process each edge fragment or unfragmented edge has an associated edge placement error.

Next, the edge fragments are individually moved in order to improve the resolution of the simulated printed image for the resulting mask. For example, as shown in FIG. 2C, the edge fragment 201A is displaced in a direction away from the geometric element 201, in an effort to widen the corresponding portion of the image that would be produced by the resulting mask. Similarly, the edge fragment 201C is displaced in a direction toward from the geometric element 201, in an effort to narrow the corresponding portion of the image that would produced by the resulting mask. Next, the image that would be produced by a mask using the displaced edge fragments is simulated, and the new simulated image is compared with the target image, and the edge placement errors for each edge fragment are computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the optical proximity correction process. Typically, edge fragments moved during an given iteration, and the distance the edge fragments are displaced is determined based upon the edge placement error. For example, an optical proximity correction process may move the edge fragments some factor of the edge placement error away from the simulated printed image. Additionally, each edge fragment could be displaced the same distance during a given iteration. The specific parameters than control edge movement is dependant upon the tool used to implement the optical proximity correction process and the optical proximity correction process recipe.

Figure 2D:
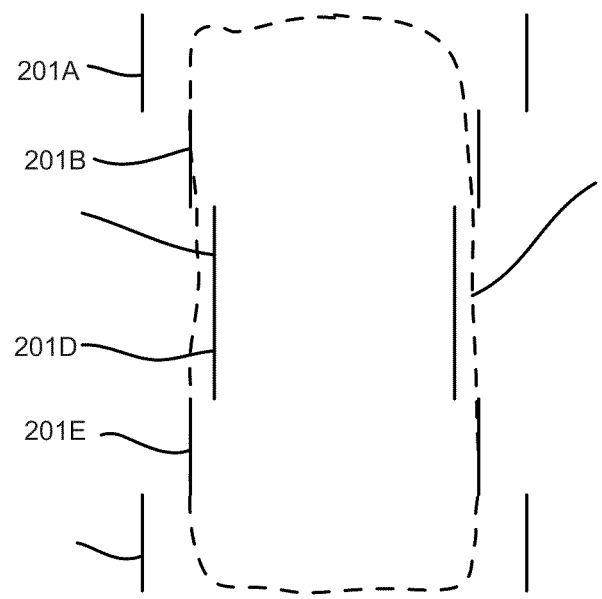
FIG. 2D illustrates final positions of the edge fragments and a corresponding simulated printed image.
Figure 1B:
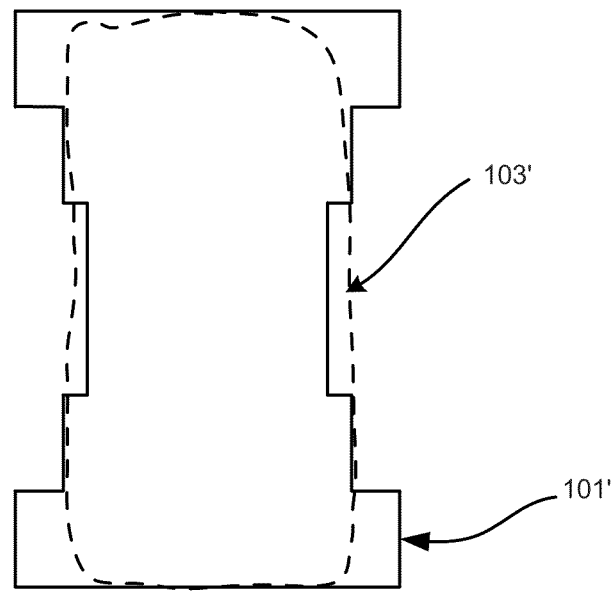
FIG. 1B illustrates a modified mask feature and a simulated printed image produced by the modified mask feature.
Figure 2B:
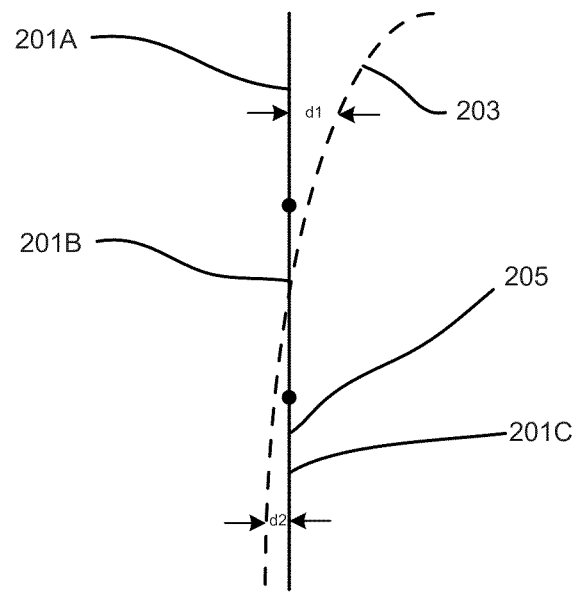
FIG. 2B illustrates target images and simulated printed images for three edge fragments.
Figure 2C:
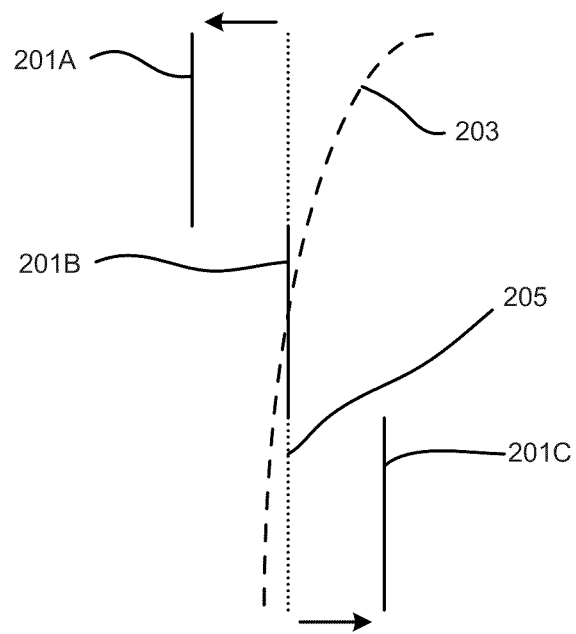
FIG. 2C illustrates edge fragment position adjustments for improving the simulated printed image of an edge.

Typically, these steps will be repeated until the simulated image is sufficiently similar to the target image (e.g., both d1 and d2 are smaller than a threshold value), or until it is determined that the displacements of the edge fragments already have converged on locations where no further movement of the edge fragments will improve the simulated image, as shown in FIG. 2D. Once the final positions of the edge fragments are determined in the layout design data, as shown in FIG. 2D, a modified mask feature 101' can be created from the corrected layout design, data. As shown in FIG. 1B, the image 103' produced by the modified mask feature 101' should more closely correspond to the target image.

Contour Alignment

A cost function to compare simulation to measured contours is used in contour-based lithographic model calibration. In the model building, calibration is performed by varying the model's parameters. This produces different simulation contours and hence different model fitness to be used to reduce the contour difference.

The simulation to measurement contour difference is measured within a bounded neighborhood which typically is a layout area representing the SEM image FOV. This is done in bidirectional fashion from measurement to simulation and vice versa to capture extra print or misprint in either set of contours such as shown in FIG. 1. The metric is a weighted RMS of contour point errors each of which represents the distance of a point in one contour to a closest point on the other contour.

Figure 3:
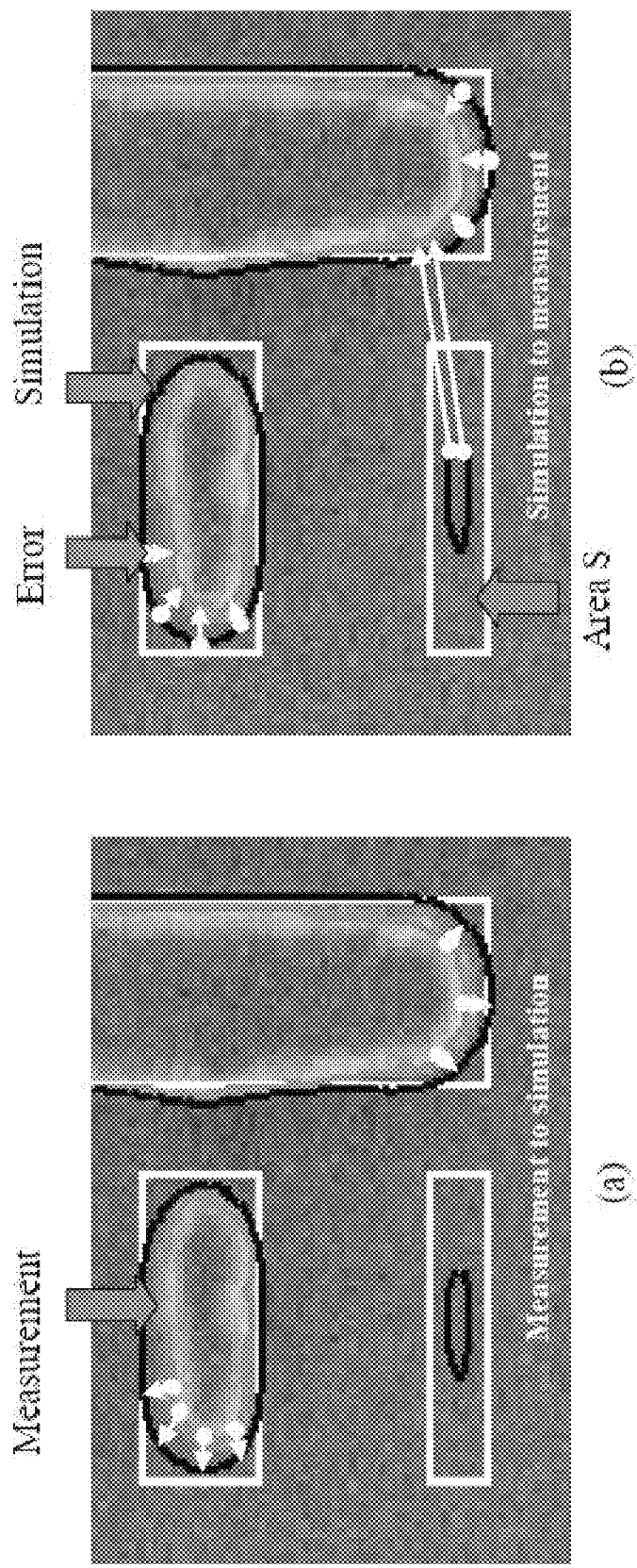
FIG. 3 illustrates an example of bidirectional contour point error determination.

FIG. 3 illustrates the bidirectional contour distance calculation: (a) distance from measurement to simulation, (b) distance from simulation to measurement. Area S is an example where an extra simulation occurs resulting in a larger overall distance in (b) since the closest measurement points belong to different design feature.

For simplicity, the following description refers to a set of contours covered by single SEM image FOV and error is depicted as single direction from the measurement to simulation. Assuming a perfect alignment, the contour distance from measurement to simulation is given by the following equation (10):

$$E_{RMS} = \sqrt{\frac{\sum_{i=1}^{N} w_i D_i^2}{\sum_{i=1}^{N} w_{i|}}} \quad (10)$$

where N is the number of points in the measurement contour, $w_i$ the weight, and $D_i$ is the error defined as a Euclidean distance from point i of the measurement contour to the closest point in simulation contour.

Figure 4:
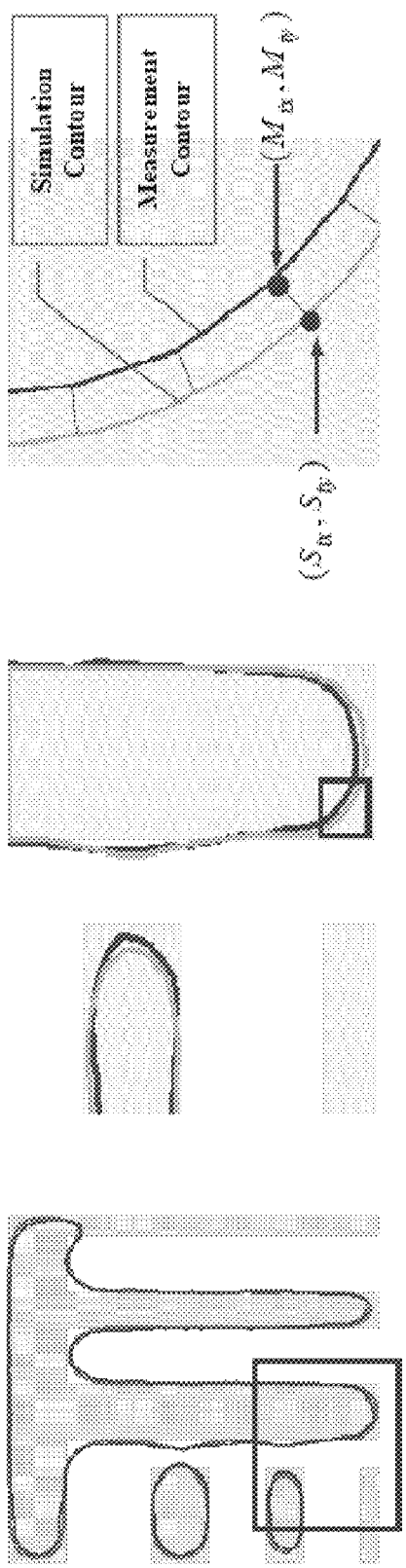
FIG. 4 illustrates an example of a contour point error that is Euclidean distance from a point Mi in a measurement contour to the closest point Si in a simulation contour.

As shown in FIG. 4, an error is Euclidean distance from a point Mi in measurement contour to the closest point Si in simulation contour. Error of point $M_i$ is given by:

$$D_i = \sqrt{(S_{ix} - M_{ix})^2 + (S_{iy} - M_{iy})^2} = \sqrt{D_{ix}^2 + D_{iy}^2} \quad (20)$$

Let the measurement contours be misaligned by $(T_x, 0)$, then the error at point $M_i$ can be rewritten as:

$$E_i^2 = (S_{ix} - M_{ix} + T_x)^2 + (S_{iy} - M_{iy} + 0)^2 \quad (30)$$
$$= (D_{ix} + T_x)^2 + D_{iy}^2$$

Taking into account the misalignment, the contour distance becomes:

$$E_{RMS} = \sqrt{\frac{\sum_{i=1}^{N} w_i E_i^2}{\sum_{i=1}^{N} w_i}} \quad (40)$$

In this case, the misalignment is equivalent to solving $T_x$ such that $E_{RMS}$ is minimum that is when the following is minimum:

$$E_{SSQ} = \sum_{i=1}^{N} w_i E_i^2 \quad (50)$$

$$= \sum_{i=1}^{N} w_i (T_x^2 + 2D_{ix}T_x + D_{ix}^2 + D_{iy}^2)$$

$$= T_x^2 \sum_{i=1}^{N} w_i + 2T_x \sum_{i=1}^{N} w_i D_{ix} + \sum_{i=1}^{N} w_i (D_{ix}^2 + D_{iy}^2)$$

or, when the following condition is met:

$$\frac{\partial E_{SSQ}}{\partial T_x} = 2T_x \sum_{i=1}^{N} w_i + 2 \sum_{i=1}^{N} w_i D_{ix} = 0 \quad (60)$$

This leads a solution for $T_x$ $$T_x = -\frac{\sum_{i=1}^{N} w_i D_{ix}}{\sum_{i=1}^{N} w_i} = -\frac{\sum_{i=1}^{N} w_i (S_{ix} - M_{ix})}{\sum_{i=1}^{N} w_i} \quad (70)$$

Similarly for misalignment of $(0, T_y)$ $$T_y = -\frac{\sum_{i=1}^{N} w_i (S_{iy} - M_{iy})}{\sum_{i=1}^{N} w_i} \quad (80)$$

Algorithmically the (mis)alignment info (in this case $T_x$ and $T_y$) is obtainable at the same time as calculating contour distance $E_{RMS}$ if Eq. (80) and thus it serves as supplement to model fitness that is being reported. There are several possibilities as to how the info can be utilized. One option is to use the alignment info simply to supplement the fitness reporting. This is basically saying that the reported fitness for a given model includes some errors due to misalignment. Another option is to use the info to correct the fitness (1) by recalculating fitness each time misalignment occurs, or (2) by using it as a basis for calculating fitness in the next iteration, or (3) by calculating it up front to correct the fitness for rest of iterations. This is stating that the cost function self aligns the input contours as the calibration progresses.

A test on self-aligning cost functions is conducted by building some resist models and compare the relative final fitness as well as various alignment reporting, such as alignment errors and the corrected measurement contours. In these tests, input contours are organized in blocks each representing a clip inside the SEM image FOV. Misalignment is handled, corrected, and reported per individual contour block. The calibration, however, evaluates a model based on the overall fitness.

Figure 5:
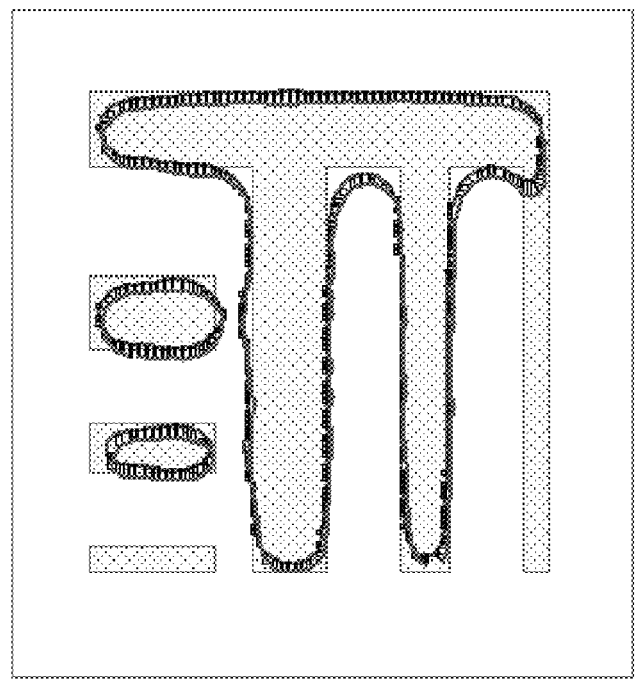
FIG. 5 illustrates misaligned and self-aligned measurement contours for a block of layout features.
Figure 5:
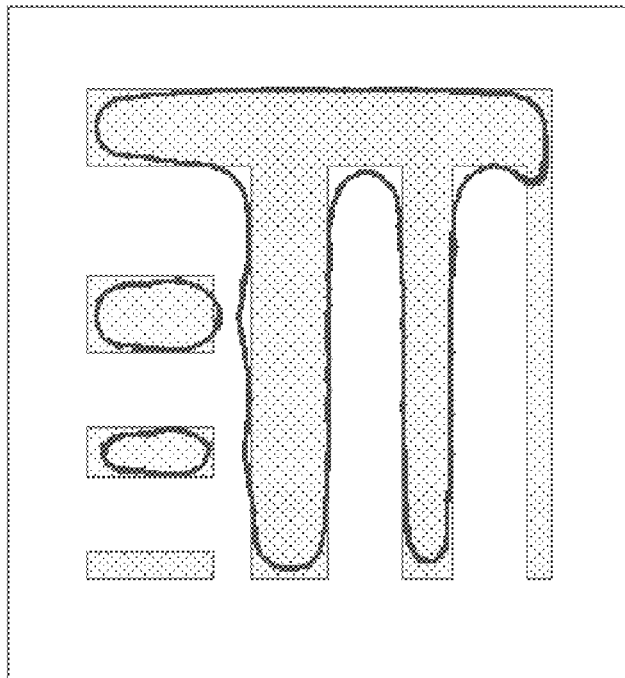

The test consists of a single block of contours that represent features completely enclosed inside FOV. Here, an artificially induced misalignment was applied. The relative fitness of the test is shown in Table 1. In the first row, as expected, the fitness of a misaligned input is relatively large indicating calibration inaccuracy. On the second row, with self-alignment in effect, the fitness is relatively better. This is of course after a correction. On the third row, self-alignment is turned off, however the input was aligned by a previously run self-alignment. The errors of both misaligned input and self-aligned input are visually described in FIG. 5.

TABLE 1

Fitness comparison

| CM1 Build | Fitness (nm) | Alignment Correction (nm) |
|---|---|---|
| Self alignment OFF | 18.1 | N/A |
| Self alignment ON | 3.11 | X = −8.4, Y = 27.1 |
| Input is pre-aligned | 3.04 | N/A |

Figure 6A:
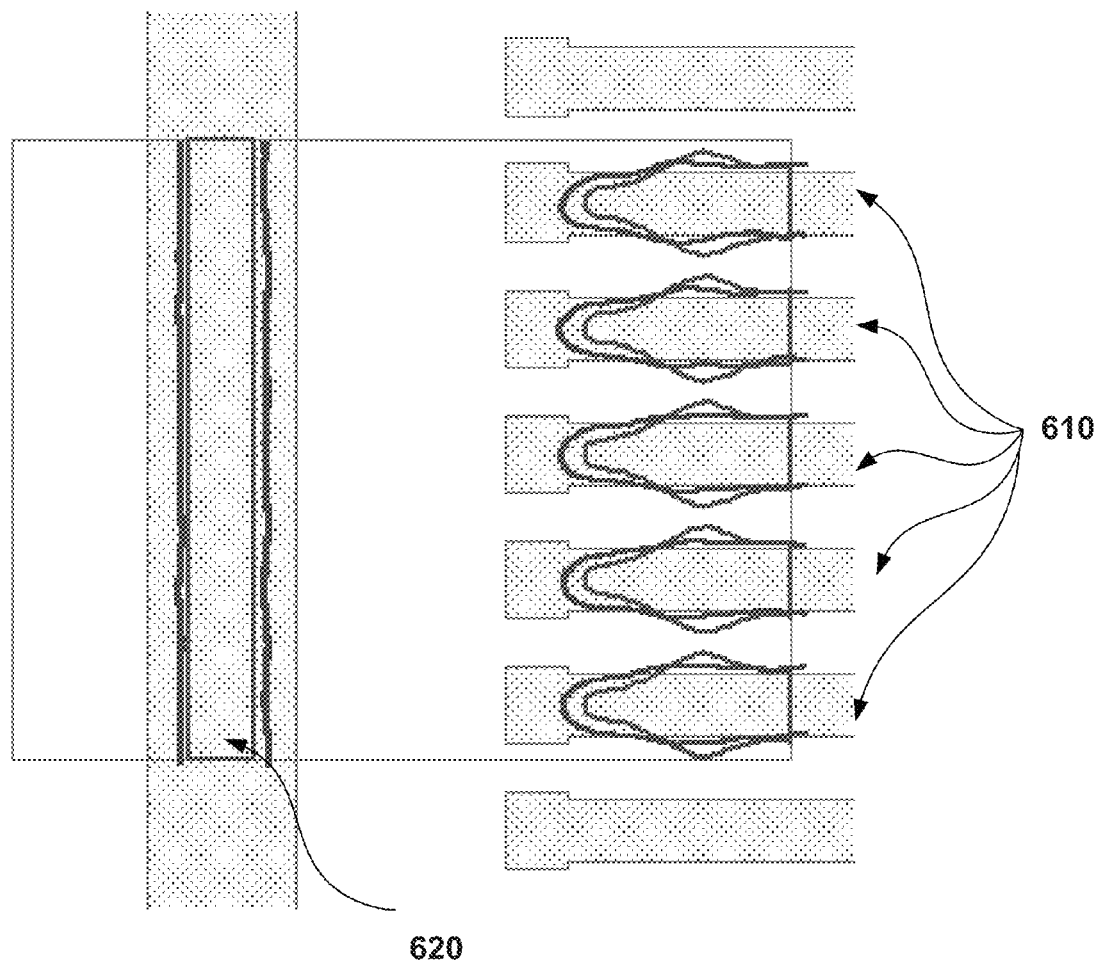
FIG. 6A illustrates an example of asymmetric layout features in a block.
Figure 6B:
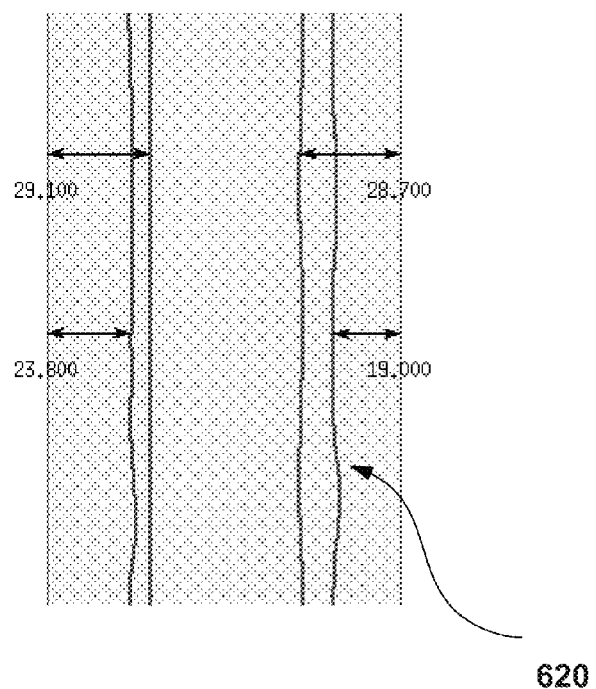
FIG. 6B illustrates alignment of the line feature 620 shown in FIG. 6A obtained using constant weights.
Figure 6C:
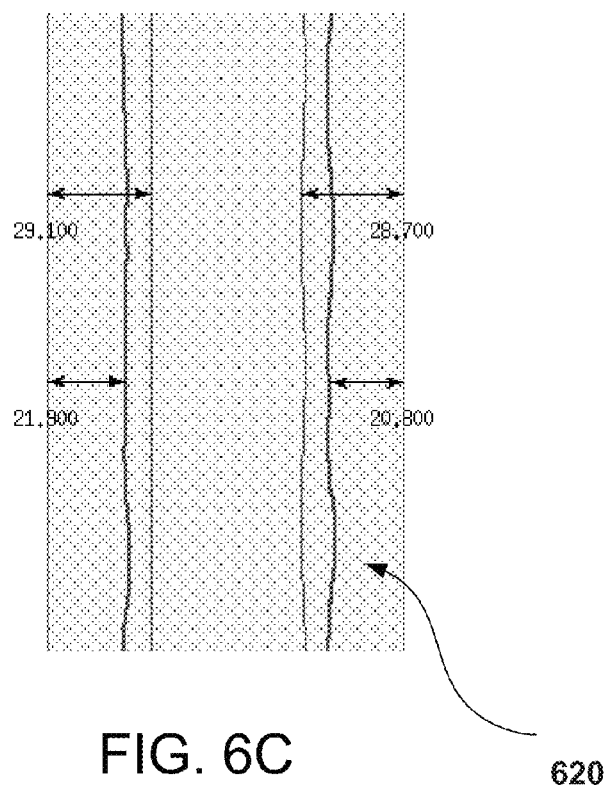
FIG. 6C illustrates improved alignment of the vertical line feature 620 shown in FIG. 6A obtained assigning more weights to the region around the vertical line feature.

For asymmetric features, using uniform weights in Eq. 10 may be problematic. FIG. 6 illustrates such asymmetric features, including horizontal line-end features 610 and a vertical line feature 620. The horizontal line-end features 610 influence heavily the overall gravity such that alignment on the vertical line is off as shown in FIG. 7A. One solution to this issue is to assign more weight to the region around the vertical line feature. The improved alignment is shown in FIG. 7B.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while only equations for deriving shift alignment parameters are given, a person having ordinary skill in the art should be able to derive equations for the rotation and scaling parameters in a similar way. Further, it should be appreciated that various forms of the cost function may be employed beside the discussed weighted root mean square of the contour point errors.

What is claimed is:
1. A method of model calibration, comprising:
by a computing device:
  receiving measurement contours and simulation contours, the measurement contours being measured contours of printed layout features on a physical wafer; the simulation contours being calculated contours of the printed layout features derived based on a model;
  determining contour point errors based on the measurement contours and the simulation contours, the contour point errors comprising Euclidean distances from points in the measurement contours to closest points in the simulation contours and also from points in the simulation contours to closest points in the measurement contours;
  determining values of alignment parameters based on a cost function and the contour point errors; and
  outputting the values of alignment parameters.

2. The method recited in claim 1, wherein the outputting comprises storing the values of alignment parameters in a medium.

3. The method recited in claim 1, wherein the measured contours are scanning electron microcopy (SEM) contours of the printed layout features.

4. The method recited in claim 1, further comprising:
receiving information about preliminary alignment of the measurement contours with the simulation contours.

5. The method recited in claim 1, further comprising:
determining fitness of the model based on the cost function and the values of alignment parameters.

6. The method recited in claim 1, further comprising:
realigning the measurement contours to the simulation contours using the values of alignment parameters;
determining an optimized model based on the realigned measurement contours;
generating new simulation contours based on the optimized model; and
determining fitness of the model based on the new simulation contours.

7. The method recited in claim 6, further comprising:
determining new values of the alignment parameters based on the new simulation contours.

8. The method recited in claim 1, wherein the contour point errors including a first set of contour point errors and a second set of contour point errors, each of the first set of contour point errors represents a distance from a point on the measurement contours to a nearest point on the simulation contours, each of the second set of contour point errors represents a distance from a point on the simulation contours to a nearest point on the measurement contours.

9. The method recited in claim 1, wherein the cost function is a weighted root mean square of the contour point errors.

10. The method recited in claim 9, wherein weights in the cost function are adjusted for asymmetric layout features.

11. The method recited in claim 1, wherein the determining values of alignment parameters comprises:
deriving values of alignment parameters by solving the cost function for each of the alignment parameters such that the cost function is minimized.

12. The method recited in claim 1, wherein the model is an optical proximity correction (OPC) model.

13. The method recited in claim 1, wherein the alignment parameters comprise shift alignment parameters a rotation alignment parameter, a scaling alignment parameter or any combination thereof.

14. A system comprising:
one or more processors; and
memory, the memory storing a plurality of instructions for directing the one or more processors to perform a method of model calibration, the method comprising:
receiving measurement contours and simulation contours, the measurement contours being measured contours of printed layout features on a physical wafer; the simulation contours being calculated contours of the printed layout features derived based on a model;
determining contour point errors based on the measurement contours and the simulation contours, the determining comprising determining distances from the measurement contours to nearest respective points on the simulation contours and also determining distances from the simulation contours to nearest respective points on the measurement contours in order to detect extra prints or misprints in the measurement contours and the simulation contours;
determining values of alignment parameters based on a cost function and the contour point errors; and
outputting the values of alignment parameters.

15. The system recited in claim 14, wherein the method further comprises:
determining fitness of the model based on the cost function and the values of alignment parameters.

16. The system recited in claim 14, wherein the method further comprises:
realigning the measurement contours to the simulation contours using the values of alignment parameters;
determining an optimized model based on the realigned measurement contours;
generating new simulation contours based on the optimized model; and
determining fitness of the model based on the new simulation contours.

17. The system recited in claim 16, wherein the method further comprises:
determining new values of the alignment parameters based on the new simulation contours.

18. The system recited in claim 14, wherein the determining values of alignment parameters comprises:
deriving values of alignment parameters by solving the cost function for each of the alignment parameters such that the cost function is minimized.

19. The system recited in claim 14, wherein the alignment parameters comprise shift alignment parameters, a rotation alignment parameter, a scaling alignment parameter or any combination thereof.

20. A non-transitory processor-readable medium storing processor-executable instructions for causing one or more processors to perform a method of model calibration, the method comprising:
receiving measurement contours and simulation contours, the measurement contours being measured contours of printed layout features on a physical wafer; the simulation contours being calculated contours of the printed layout features derived based on a model;
determining contour point errors based on the measurement contours and the simulation contours, the determining comprising determining distances from the measurement contours to respective nearest points of the simulation contours and also determining distances from the simulation contours to respective nearest points of the measurement contours in order to detect extra prints or misprints in the measurement contours and the simulation contours;
determining values of alignment parameters based on a cost function and the contour point errors; and
outputting the values of alignment parameters.

21. The non-transitory processor-readable medium recited in claim 20, wherein the method further comprises:
determining fitness of the model based on the cost function and the values of alignment parameters.

22. The non-transitory processor-readable medium recited in claim 20, wherein the method further comprises:
realigning the measurement contours to the simulation contours using the values of alignment parameters;
determining an optimized model based on the realigned measurement contours;
generating new simulation contours based on the optimized model; and
determining fitness of the model based on the new simulation contours.

23. The non-transitory processor-readable medium recited in claim 22, wherein the method further comprises:

determining new values of the alignment parameters based on the new simulation contours.

24. The non-transitory processor-readable medium recited in claim 20, wherein the determining values of alignment parameters comprises:

deriving values of alignment parameters by solving the cost function for each of the alignment parameters such that the cost function is minimized.

25. The non-transitory processor-readable medium recited in claim 20, wherein the alignment parameters comprise shift alignment parameters, a rotation alignment parameter, a scaling alignment parameter or any combination thereof.

* * * * *